(12) United States Patent
Liu et al.

(10) Patent No.: US 11,699,882 B2
(45) Date of Patent: Jul. 11, 2023

(54) BACKPLANE CONNECTOR WITH IMPROVED SHIELDING EFFECT

(71) Applicant: DONGGUAN LUXSHARE TECHNOLOGIES CO., LTD, Dongguan (CN)

(72) Inventors: Xiaogang Liu, Dongguan (CN); Rongzhe Guo, Dongguan (CN); Kun Liu, Dongguan (CN); Chuanqi Gong, Dongguan (CN); Tao Song, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 206 days.

(21) Appl. No.: 17/341,062

(22) Filed: Jun. 7, 2021

(65) Prior Publication Data

US 2021/0399479 A1 Dec. 23, 2021

(30) Foreign Application Priority Data

Jun. 19, 2020 (CN) .......................... 202010567796.4
Dec. 28, 2020 (CN) .......................... 202011577310.1

(51) Int. Cl.
*H01R 13/6471* (2011.01)
*H01R 13/40* (2006.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC ............ H01R 13/6471; H01R 13/6581; H01R 13/6585; H01R 13/6586; H01R 13/6578;
(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CN | 1244959 A | 2/2000 |
| CN | 2513252 Y | 9/2002 |

(Continued)

OTHER PUBLICATIONS

Taiwanese Office Action and Search Report for Taiwanese Application No. 109128294, dated Jun. 21, 2021, is attached.

(Continued)

*Primary Examiner* — Marcus E Harcum
(74) *Attorney, Agent, or Firm* — Birch, Stewart, Kolasch & Birch, LLP

(57) ABSTRACT

A backplane connector includes a housing and a number of terminal modules. Each terminal module includes a number of conductive terminals, a metal shield surrounding member, a first metal shield and a second metal shield. The conductive terminal includes a mating portion and a tail portion. The conductive terminals include a first signal terminal and a second signal terminal. The metal shield surrounding member surrounds the mating portions of the first signal terminal and the second signal terminal. The first metal shield and the second metal shield are in contact with the metal shield surrounding member. As a result, the shielding area is increased and the shielding effect is improved.

20 Claims, 15 Drawing Sheets

(51) Int. Cl.
    *H01R 13/6587* (2011.01)
    *H01R 13/6591* (2011.01)
    *H01R 13/514* (2006.01)
    *H01R 13/518* (2006.01)
    *H01R 12/72* (2011.01)
    *H01R 13/6586* (2011.01)
    *H01R 12/58* (2011.01)
    *H05K 1/11* (2006.01)
    *H01R 13/6588* (2011.01)
    *H01R 13/6583* (2011.01)
    *H01R 13/6585* (2011.01)
    *H01R 13/6582* (2011.01)
    *H01R 43/24* (2006.01)
    *H01R 12/71* (2011.01)
    *H01R 13/20* (2006.01)
    *H01R 13/504* (2006.01)
    *H01R 13/6461* (2011.01)
    *H01R 13/6584* (2011.01)
    *H05K 3/30* (2006.01)
    *H01R 13/02* (2006.01)
    *H05K 3/34* (2006.01)
    *H01R 13/6474* (2011.01)
    *H01R 13/502* (2006.01)
    *H01R 13/46* (2006.01)
    *H01R 13/646* (2011.01)
    *H01R 13/6473* (2011.01)
    *H01R 13/6581* (2011.01)

(52) U.S. Cl.
    CPC ........... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
    CPC ............ H01R 13/6591; H01R 13/6583; H01R 13/518; H01R 12/727; H01R 12/724; H01R 12/722; H01R 12/732; H01R 12/737
    USPC ............ 439/607.06, 607.05, 607.07, 607.08, 439/607.09
    See application file for complete search history.

(56) References Cited

U.S. PATENT DOCUMENTS

| | | | | |
|---|---|---|---|---|
| 6,322,379 B1 * | 11/2001 | Ortega | ............... | H01R 13/6471 439/607.1 |
| 6,899,566 B2 * | 5/2005 | Kline | ................. | H01R 13/6587 439/607.06 |
| 7,841,900 B2 * | 11/2010 | Liu | ....................... | H01R 12/585 439/607.07 |
| 7,905,751 B1 * | 3/2011 | Davis | ................. | H01R 13/6587 439/607.05 |
| 8,465,323 B2 * | 6/2013 | Jeon | ................... | H01R 13/6582 439/607.07 |
| 8,845,365 B2 * | 9/2014 | Schroll | .............. | H01R 13/6461 439/607.56 |
| 8,905,786 B2 * | 12/2014 | Davis | ................. | H01R 13/6587 439/607.1 |
| 8,911,255 B2 * | 12/2014 | Scherer | .............. | H01R 13/6587 439/607.07 |
| 9,350,126 B2 | 5/2016 | Little et al. | | |
| 9,548,570 B2 | 1/2017 | Laurx et al. | | |
| 10,644,453 B2 * | 5/2020 | Laurx | ............... | H01R 13/6587 |
| 10,790,620 B2 * | 9/2020 | Yuan | ................... | H01R 13/6585 |
| 10,886,666 B2 * | 1/2021 | Peng | .................. | H01R 13/6585 |
| 10,944,214 B2 * | 3/2021 | Gailus | ................ | H01R 13/6477 |
| 11,177,593 B2 * | 11/2021 | Goh | ..................... | H01R 13/6591 |
| 11,349,259 B2 * | 5/2022 | Liu | ....................... | H01R 13/6477 |
| 2004/0043658 A1 | 3/2004 | Ko | | |
| 2004/0229510 A1 | 11/2004 | Lloyd et al. | | |
| 2007/0155239 A1 | 7/2007 | Nakada | | |
| 2008/0014798 A1 | 1/2008 | Pan | | |
| 2011/0097934 A1 * | 4/2011 | Minich | ............... | H01R 13/6587 439/607.53 |
| 2011/0207342 A1 * | 8/2011 | Davis | .................. | H01R 12/724 439/65 |
| 2013/0203273 A1 | 8/2013 | Rathburn | | |
| 2014/0051295 A1 | 2/2014 | Westman et al. | | |
| 2014/0248796 A1 | 9/2014 | Pan | | |
| 2014/0295705 A1 | 10/2014 | Lee et al. | | |
| 2014/0335707 A1 * | 11/2014 | Johnescu | .......... | H01R 12/724 439/95 |
| 2015/0194771 A1 | 7/2015 | Pan | | |
| 2015/0303618 A1 | 10/2015 | Lee et al. | | |
| 2015/0318642 A1 | 11/2015 | Lee et al. | | |
| 2016/0093985 A1 | 3/2016 | Zhang et al. | | |
| 2016/0308309 A1 * | 10/2016 | Stokoe | ............... | H01R 13/6587 |
| 2016/0322760 A1 | 11/2016 | Long et al. | | |
| 2018/0166828 A1 | 6/2018 | Gailus | | |
| 2019/0044284 A1 | 2/2019 | Dunham | | |
| 2020/0194941 A1 * | 6/2020 | Chen | .................. | H01R 13/4364 |
| 2020/0266585 A1 * | 8/2020 | Paniagua | ............. | H01R 13/652 |
| 2021/0203105 A1 * | 7/2021 | Liu | ........................ | H05K 3/366 |
| 2021/0203108 A1 * | 7/2021 | Liu | ........................ | H01R 12/55 |
| 2022/0231465 A1 * | 7/2022 | Zhao | .................. | H01R 13/6587 |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |

(56) References Cited

FOREIGN PATENT DOCUMENTS

| | | | |
|---|---|---|---|
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105812664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| CN | 111682369 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | M537321 U | 2/2017 |
| TW | 201733225 A | 9/2017 |
| TW | I600231 B | 9/2017 |
| TW | 201810825 A | 3/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| TW | 202046584 A | 12/2020 |
| WO | WO-9926321 A1 * | 5/1999 | ......... H01R 13/6585 |
| WO | WO 2016/168820 A1 | 10/2016 |
| WO | WO 2017/106266 A1 | 6/2017 |

OTHER PUBLICATIONS

Taiwanese Office Action and Search Report for Taiwanese Application No. 109128295, dated Apr. 14, 2021, is also attached.
Taiwanese Office Action and Search Report for Taiwanese Application No. 109129936, dated Aug. 9, 2021, is also attached.
Chinese Office Action and Search Report for Chinese Application No. 202011577310.1, dated Nov. 23, 2021, is attached.
Chinese Office Action and Search Report for Chinese Application No. 202011577786.5, dated Feb. 16, 2022, is attached.
Chinese Office Action and Search Report for Chinese Application No. 202110035372.8, dated Jan. 6, 2022, is attached.
Taiwanese Office Action and Search Report for Taiwanese Application No. 110104064, dated Dec. 9, 2021, is attached.
Taiwanese Office Action and Search Report for Taiwanese Application No. 110104068, dated Jan. 26, 2022, is attached.
Taiwanese Office Action and Search Report for Taiwanese Application No. 110117853, dated Feb. 9, 2022, is attached.
Taiwanese Office Action and Search Report for Taiwanese Application No. 110104066, dated Feb. 2, 2023.
Taiwanese Office Action and Search Report for Taiwanese Application No. 110144691, dated Jan. 12, 2023.

* cited by examiner ent and the second signal terminal in areas where the mating portions thereof are located. In addition, by providing the first metal shield and the second metal shield, and electrically connecting them with the metal shield surrounding member, the shielding area is increased and the shielding effect is further improved.

BACKPLANE CONNECTOR WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202011577310.1, filed on Dec. 28, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

The existing backplane connectors usually includes a housing and a plurality of terminal modules mounted to the housing. Each terminal module includes an insulating bracket, a plurality of conductive terminals insert-molded with the insulating bracket, and a metal shield disposed on at least one side of the insulating bracket.

However, with the continuous improvement of the signal transmission requirements of high-speed connectors, there is still room for improvement in the shielding of the conductive terminals of the existing backplane connectors.

SUMMARY

An object of the present disclosure is to provide a backplane connector with improved shielding effect.

In order to achieve the above object, the present disclosure adopts the following technical solution: a backplane connector, comprising: a housing comprising a receiving space; and a plurality of terminal modules mounted to the housing, each terminal module comprising: a plurality of conductive terminals, each of the conductive terminals comprising a mating portion and a tail portion; a plurality of metal shield surrounding members which are spaced apart from one another along a first direction and protrude into the receiving space; a first metal shield located on one side of the plurality of conductive terminals, the first metal shield comprising a first extension portion; and a second metal shield located on the other side of the plurality of conductive terminals, the second metal shield comprising a second extension portion; wherein the conductive terminals comprise a first signal terminal and a second signal terminal, each of the first signal terminal and the second signal terminal comprises the mating portion and the tail portion, the mating portion of the first signal terminal and the mating portion of the second signal terminal both protrude into the receiving space and are spaced apart from each other along the first direction; wherein the metal shield surrounding member surrounds a periphery of the mating portion of the first signal terminal and the mating portion of the second signal terminal; and wherein the first extension portion and the second extension portion are electrically connected to the metal shield surrounding member along a second direction perpendicular to the first direction.

Compared with the prior art, by providing a metal shield surrounding member, the backplane connector of the present disclosure improves the shielding effect of the first signal terminal and the second signal terminal in areas where the mating portions thereof are located. In addition, by providing the first metal shield and the second metal shield, and electrically connecting them with the metal shield surrounding member, the shielding area is increased and the shielding effect is further improved.

DETAILED DESCRIPTION

Figure 1:
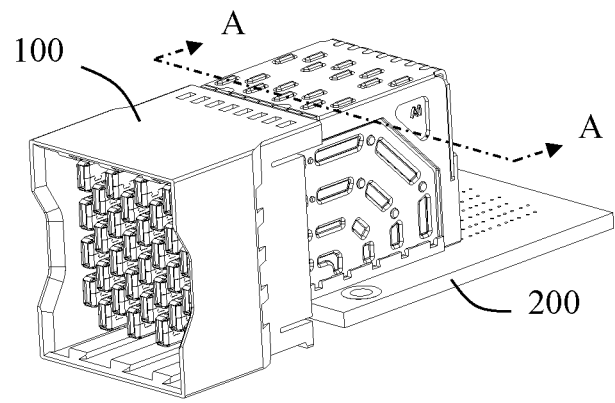
FIG. 1 is a perspective schematic view of a backplane connector in accordance with an embodiment of the present disclosure when it is mounted on a circuit board.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
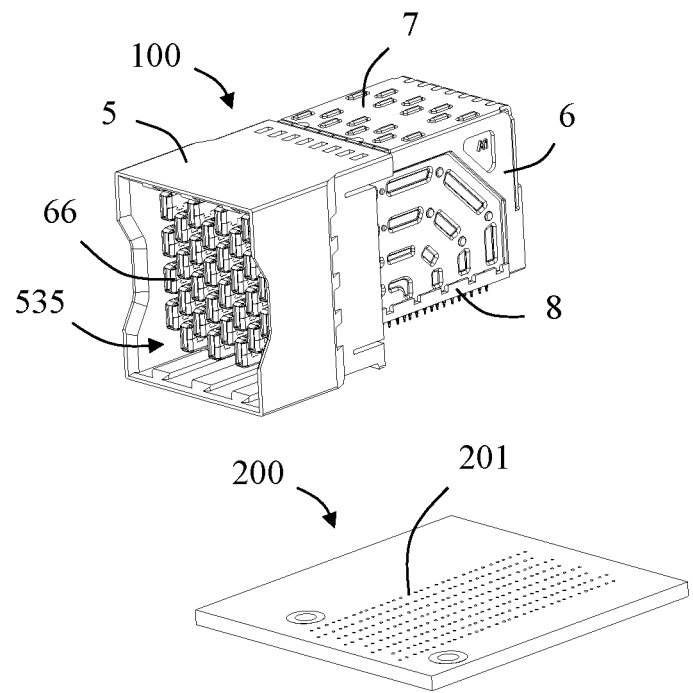
FIG. 2 is a partial perspective exploded view of FIG. 1.
Figure 3:
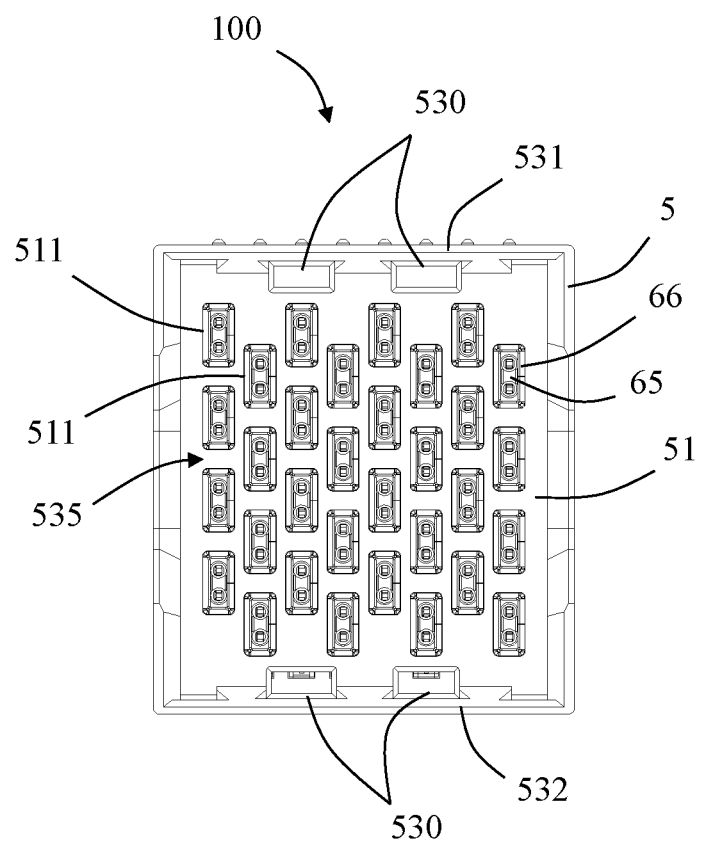
FIG. 3 is a front view of the backplane connector in FIG. 2.

Referring to FIGS. 1 and 2, an embodiment of the present disclosure discloses a backplane connector 100 for being mounted on a circuit board 200. The backplane connector 100 is used for mating with a mating backplane connector (not shown) so as to achieve data transmission. The circuit board 200 includes a plurality of insertion holes 201. In the illustrated embodiment of the present disclosure, the insertion holes 201 are conductive holes.

Referring to FIGS. 3 to 6, the backplane connector 100 includes a housing 5, a plurality of terminal modules 6 mounted to the housing 5, a spacer 7 for fixing the plurality of terminal modules 6 together, and a mounting block 8 mounted at a bottom end of the plurality of terminal modules 6.

Figure 4:
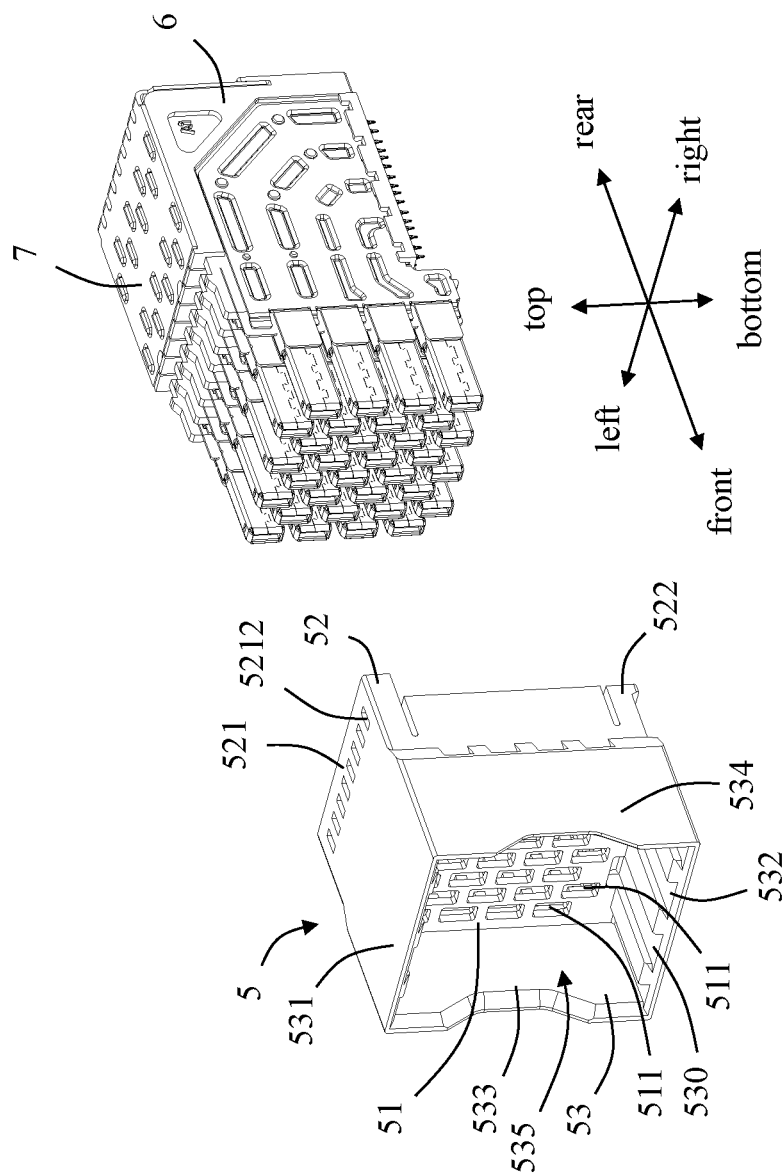
FIG. 4 is a partial perspective exploded view of the backplane connector in FIG. 2.
Figure 5:
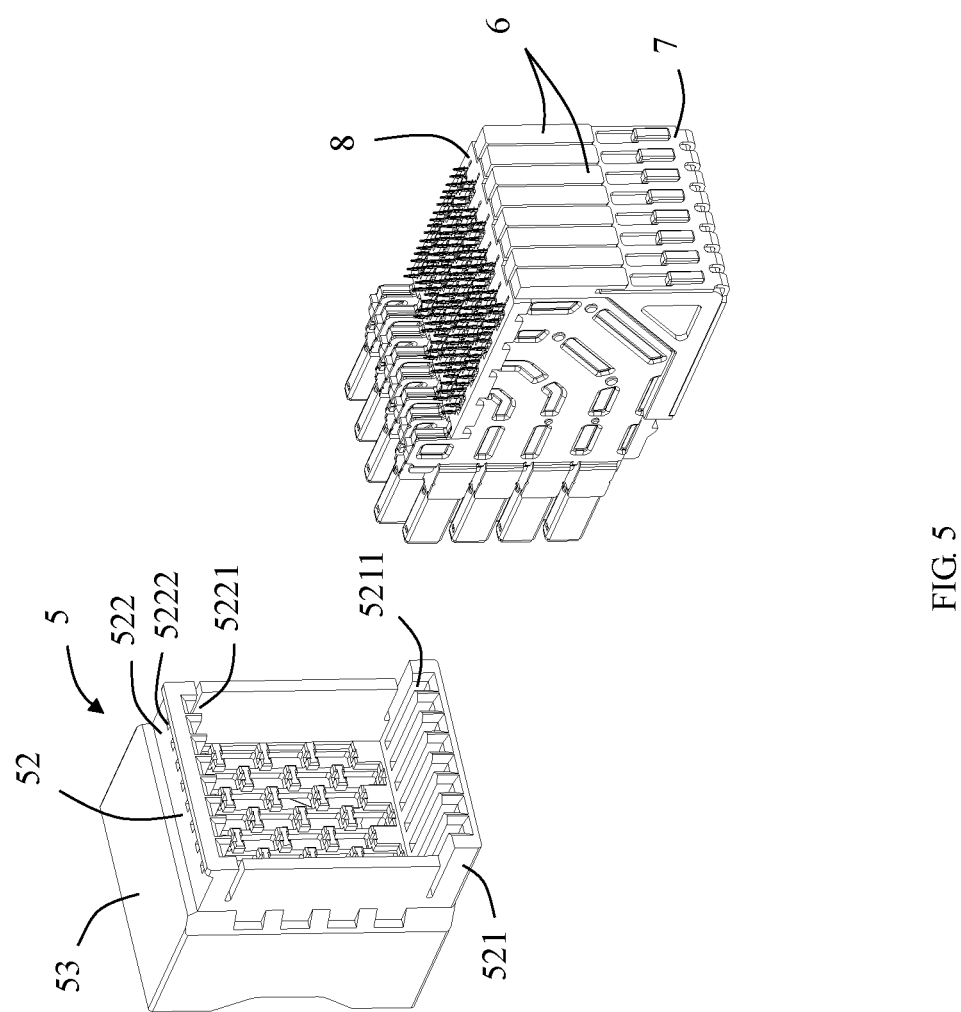
FIG. 5 is a partially exploded perspective view of FIG. 4 from another angle.

Referring to FIGS. 4 and 5, the housing 5 is made of insulating material. The housing 5 includes a body portion 51, a wall portion 52 extending from the body portion 51 to one end (for example, extending rearwardly), and a frame portion 53 extending from the body portion 51 to the other end (for example, extending forwardly). The body portion 51 includes a plurality of terminal receiving grooves 511 extending along a front-rear direction. In the illustrated embodiment of the present disclosure, the terminal receiving grooves 511 are disposed in multiple rows along a left-right direction. Two adjacent rows of terminal receiving grooves 511 are staggered in a top-bottom direction. That is, the terminal receiving grooves 511 at corresponding positions in the two adjacent rows of terminal receiving grooves 511 are not in alignment in the left-right direction. The wall portion 52 includes a first wall portion 521 and a second wall portion 522 disposed opposite to each other. The first wall portion 521 includes a plurality of first slots 5211 and a plurality of first locking slots 5212 in communication with the corresponding first slots 5211. The second wall portion 522 includes a plurality of second slots 5221 and a plurality of second locking slots 5222 in communication with the corresponding second slots 5221. The first slot 5211 and the second slot 5221, which are in alignment with each other, together with the terminal receiving groove 511 corresponding to the first slot 5211 and the second slot 5221 are jointly used for receiving the same terminal module 6 to prevent the terminal module 6 from being separated from the housing 5.

Referring to FIGS. 4 and 5, the frame portion 53 includes a first extension wall 531, a second extension wall 532 opposite to the first extension wall 531, a third extension wall 533 connecting one end of the first extension wall 531 and one end of the second extension wall 532, a fourth extension wall 534 connecting the other end of the first extension wall 531 and the other end of the second extension wall 532, and a receiving space 535 jointly enclosed by the first extension wall 531, the second extension wall 532, the third extension wall 533 and the fourth extension wall 534. The receiving space 535 is used for at least partially accommodating the mating backplane connector (not shown). Specifically, referring to FIGS. 3 and 4, in the illustrated embodiment of the present disclosure, both the first extension wall 531 and the second extension wall 532 include a plurality of positioning grooves 530 in order to improve the mating accuracy of the mating backplane connector (not shown) and the backplane connector 100. In the illustrated embodiment of the present disclosure, each positioning groove 530 is a dovetail groove.

Figure 7:
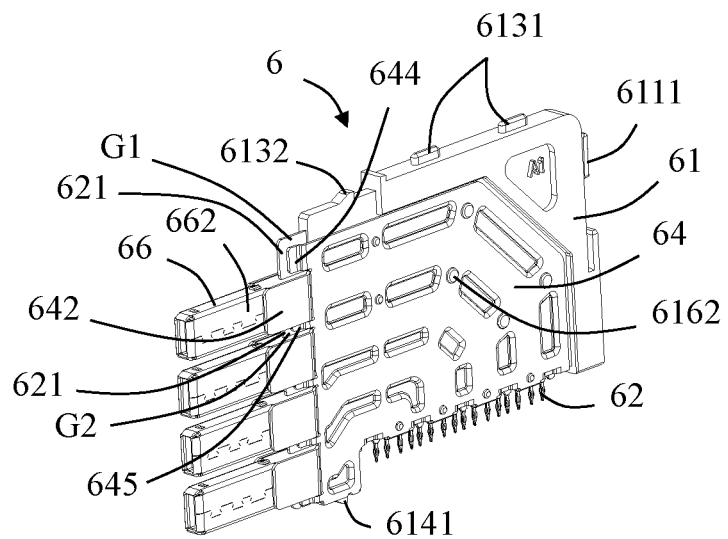
FIG. 7 is a perspective schematic view of a terminal module in FIG. 6.
Figure 8:
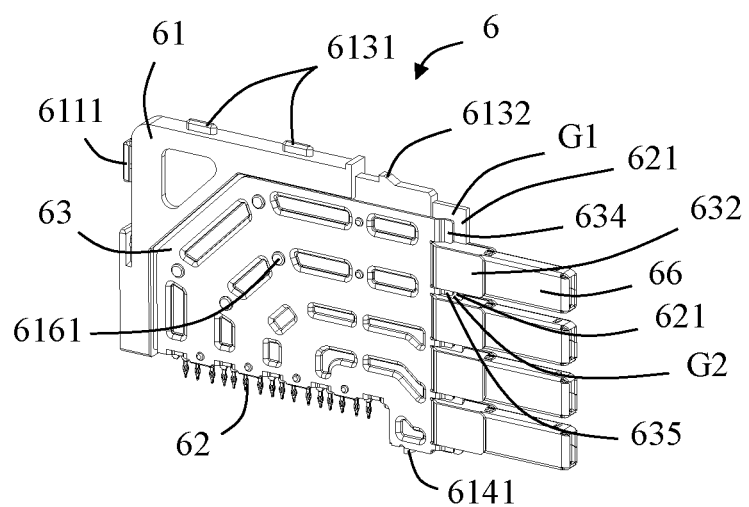
FIG. 8 is a perspective schematic view of FIG. 7 from another angle.
Figure 9:
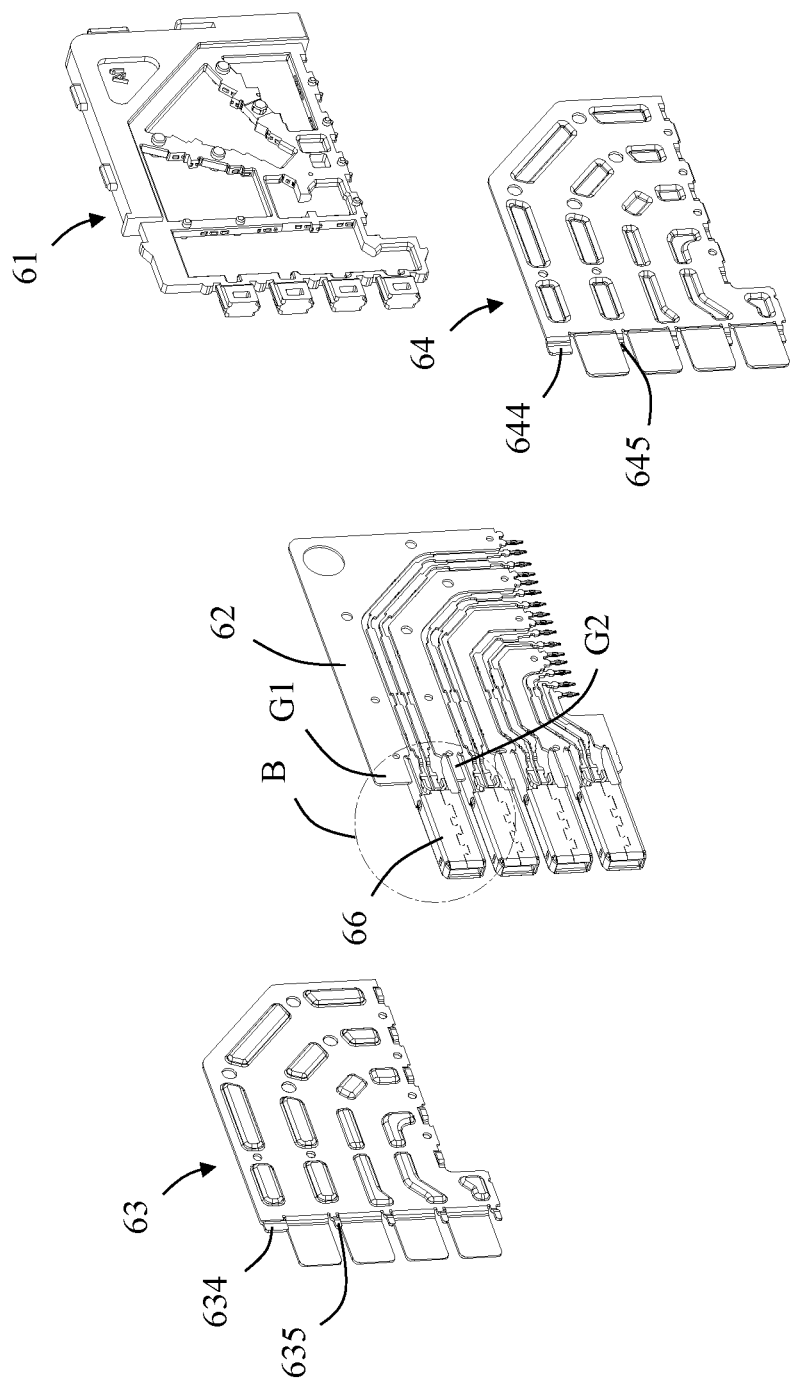
FIG. 9 is a partially exploded perspective view of FIG. 7.

Referring to FIGS. 7 and 8, each terminal module 6 includes an insulating bracket 61, a plurality of conductive terminals 62 insert-molded with the insulating bracket 61, a first metal shield 63 fixed on one side of the insulating bracket 61, and a second metal shield 64 fixed on the other side of the insulating bracket 61.

Figure 15:
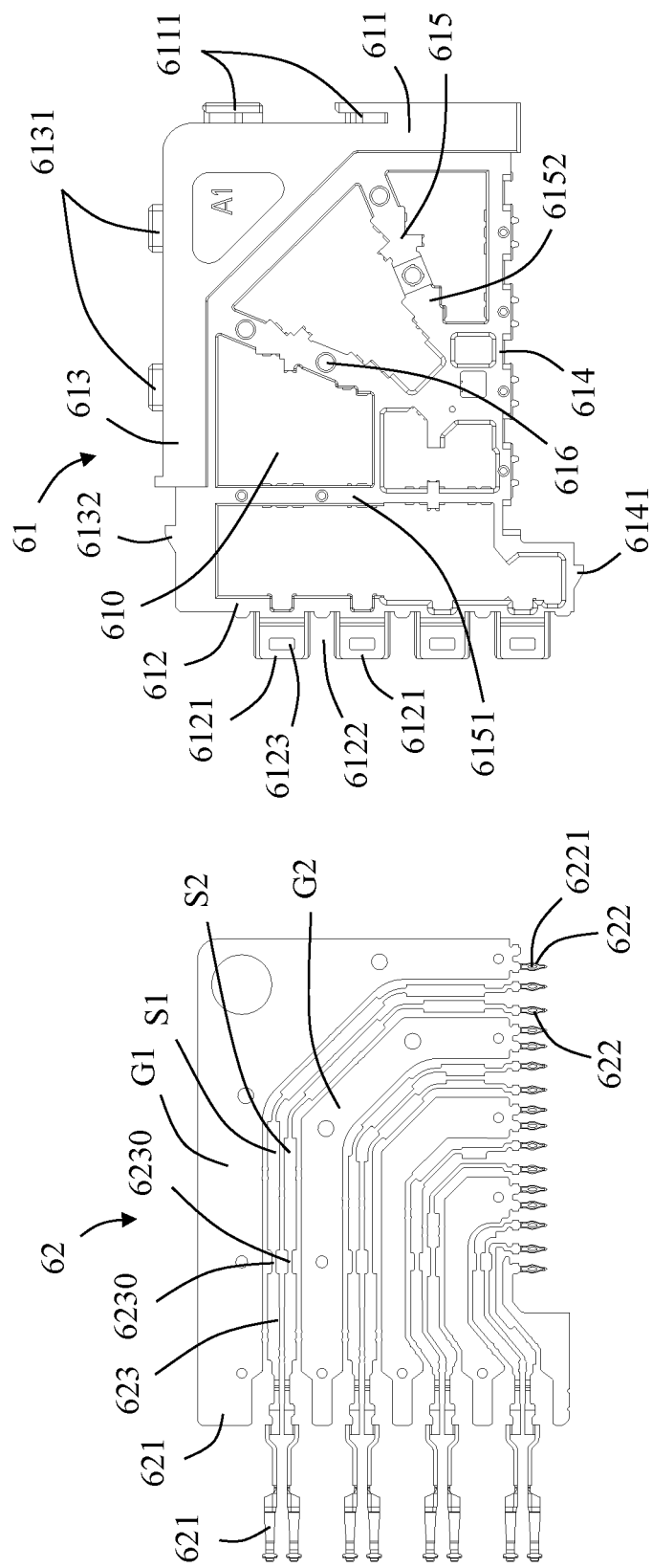
FIG. 15 is a right side view of the conductive terminals and the insulating bracket in FIG. 9 when they are separated from each other.

Referring to FIG. 15, the insulating bracket 61 is roughly frame-shaped. Each insulating bracket 61 includes a rear wall 611, a front wall 612 opposite to the rear wall 611, a top wall 613 connecting one end of the rear wall 611 and one end of the front wall 612, a bottom wall 614 connecting the other end of the rear wall 611 and the other end of the front wall 612, and a plurality of connecting walls 615. The connecting walls 615 can enhance the structural strength of the frame. The top wall 613 includes a plurality of positioning protrusions 6131 protruding upwardly and a first locking protrusion 6132 protruding upwardly. The first locking protrusion 6132 is located in front of the positioning protrusions 6131. The bottom wall 614 includes a second locking protrusion 6141 protruding downwardly. The rear wall 611 includes a plurality of latching protrusions 6111 protruding rearwardly. The first locking protrusion 6132 and the second locking protrusion 6141 are respectively in lock with the first locking slot 5212 and the second locking slot 5222 of the housing 5 so as to prevent the terminal module 6 from being improperly separated from the housing 5. In the illustrated embodiment of the present disclosure, the insulating bracket 61 includes a hollow portion 610. The connecting walls 615 include a first connecting wall 6151 connecting the top wall 613 and the bottom wall 614, and a second connecting wall 6152 connecting the rear wall 611 and the bottom wall 614. The first connecting wall 6151 and the second connecting wall 6152 are exposed in the hollow portion 610.

Referring to FIG. 15, the front wall 612 includes a plurality of protruding blocks 6121 disposed at intervals and a groove 6122 located between two adjacent protruding blocks 6121. The protruding block 6121 includes an opening 6123 to partially expose corresponding conductive terminal 62 in order to adjust the impedance.

The insulating bracket 61 further includes a plurality of posts 616 for fixing and positioning the first metal shield 63 and the second metal shield 64. Referring to FIGS. 7 and 8, the first metal shield 63 and the second metal shield 64 are located on two sides of the insulating bracket 61, respectively. The posts 616 include a plurality of first posts 6161 and a plurality of second posts 6162. The first posts 6161 and the second posts 6162 are located on opposite sides of the insulating bracket 61 so to be fixed to the first metal shield 63 and the second metal shield 64, respectively.

Referring to FIG. 15, in the illustrated embodiment of the present disclosure, each group of conductive terminals 62 includes a contact portion 621, a tail portion 622 and a connection portion 623 connecting the mating portion 621 and the tail portion 622. Some of the contact portions 621 are used to electrically connect with the mating backplane connector (not shown). The tail portions 622 are used to be mounted to the circuit board 200. In the illustrated embodiment of the present disclosure, each tail portion 622 includes a perforation 6221, so that the tail portion 622 has a certain elastic deformation ability. The tail portions 622 are pressed into the conductive holes so as to achieve electrical conduction with the circuit board 200. In the illustrated embodiment of the present disclosure, an extending direction of the mating portion 621 is substantially perpendicular to an extending direction of the tail portion 622, and the connection portion 623 is of a curved configuration.

Each group of conductive terminals 62 include a plurality of first ground terminals G1, a plurality of second ground terminals G2, and a plurality of signal terminals. The plurality of signal terminals include a plurality of first signal terminals S1 and a plurality of second signal terminals S2. In the illustrated embodiment of the present disclosure, the adjacent first signal terminal S1 and the second signal terminal S2 form a pair of differential signal terminals (Differential Pair). Each pair of differential signal terminals are located between one first ground terminal G1 and one second ground terminal G2. That is, each group of conductive terminals 62 are disposed in a manner of G1-S1-S2-G2, which is beneficial to improve the quality of signal transmission. The differential signal terminals are narrow-side coupling or wide-side coupling. A width of the first ground terminal G1 and a width of the second ground terminal G2 are greater than a width of each first signal terminal S1 and a width of each second signal terminal S2 therebetween, which is beneficial to increase the shielding area and improve the shielding effect.

In the illustrated embodiment of the present disclosure, the connection portions 623 of the conductive terminals 62 are insert-molded with the insulating bracket 61. Each of the connection portions 623 of the first signal terminal S1 and the second signal terminal S2 includes a narrowed portion 6230 embedded in the insulating bracket 61 for adjusting the impedance of the first signal terminal S1 and the second signal terminal S2 in order to achieve impedance matching.

Referring to FIGS. 11 to 14, in the illustrated embodiment of the present disclosure, the mating portion 621 of the first signal terminal S1 includes a first deflection portion 6211 extending integrally with the connection portion 623 of the first signal terminal S1, a first bending portion 6212 bent from a top of the first deflection portion 6211, and a first elastic arm portion 6213 connected with the first bending portion 6212. The first deflection portion 6211 is inclined to a side away from the first metal shield 63, so that a first end portion 6211a of the first deflection portion 6211 and the connection portion 623 of the first signal terminal S1 are located in different vertical planes. The first bending portion 6212 includes a first main portion 6212a formed by bending 90 degrees from a top edge of the first end portion 6211a to a side where the first metal shield 63 is located, a first inclined portion 6212b extending forwardly and obliquely from the first main portion 6212a to one side of the second signal terminal S2, and a first protruding portion 6212c extending forwardly and horizontally from the first inclined portion 6212b. The first elastic arm portion 6213 is connected to the first protruding portion 6212c. The first elastic arm portion 6213 includes a first main portion 6213a, a first elastic arm 6213b formed by bending upwardly from one side of the first main portion 6213a and a second elastic arm 6213c formed by bending upwardly from the other side of the first main portion 6213a. The first elastic arm 6213b and the second elastic arm 6213c are disposed face to face. The first elastic arm portion 6213 includes a first insertion space 6213d between the first elastic arm 6213b and the second elastic arm 6213c. The first elastic arm 6213b includes a first mating surface 6213e protruding into the first insertion space 6213d. The second elastic arm 6213c includes a second mating surface 6213f protruding into the first insertion space 6213d. The first insertion space 6213d is used for receiving a conductive pin (not shown) of the mating backplane connector. The first elastic arm 6213b and the second elastic arm 6213c are used to clamp the conductive pin so as to improve the contact reliability. Both the first mating surface 6213e and the second mating surface 6213f are substantially arc-shaped for abutting against the conductive pin.

In the illustrated embodiment of the present disclosure, the mating portion 621 of the second signal terminal S2 includes a second deflection portion 6216 extending integrally with the connection portion 623 of the second signal terminal S2, a second bending portion 6217 bent from a bottom of the first deflection portion 6216, and a second elastic arm portion 6218 connected with the second bending portion 6217. The second deflection portion 6216 is inclined to a side away from the first metal shield 63 so that a second end portion 6216a of the first deflection portion 6216 and the connection portion 623 of the second signal terminal S2 are located in different vertical planes. The second bending portion 6217 includes a second main portion 6217a formed by bending 90 degrees from a bottom edge of the second end portion 6216a to a side where the first metal shield 63 is located, a second inclined portion 6217b extending forwardly and obliquely from the second main portion 6217a to one side of the first signal terminal S1, and a second protruding portion 6217c extending forwardly and horizontally from the second inclined portion 6217b. The second elastic arm portion 6218 is connected to the second protruding portion 6217c. The second elastic arm portion 6218 includes a second main portion 6218a, a third elastic arm 6218b bent downwardly from one side of the second main portion 6218a, and a fourth elastic arm 6218c bent downwardly from the other side of the second main portion 6218a. The third elastic arm 6218b and the fourth elastic arm 6218c are disposed face to face. The second elastic arm portion 6218 includes a second insertion space 6218d between the third elastic arm 6218b and the fourth elastic arm 6218c. The third elastic arm 6218b includes a third mating surface 6218e protruding into the second insertion space 6218d. The fourth elastic arm 6218c includes a fourth mating surface 6218f protruding into the second insertion space 6218d. The second insertion space 6218d is used for receiving a conductive pin (not shown) of the backplane connector. The third elastic arm 6218b and the fourth elastic arm 6218c are used to clamp the conductive pin so as to improve the contact reliability. Both the third mating surface 6218e and the fourth mating surface 6218f are substantially arc-shaped for abutting against the conductive pin.

Figure 13:
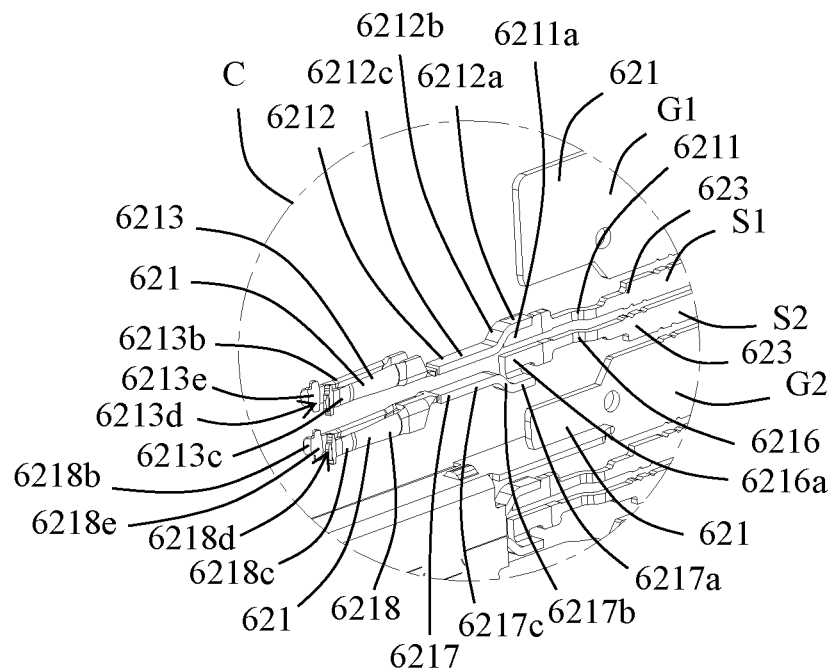
FIG. 13 is a partial enlarged view of a circled portion C in FIG. 11.
Figure 14:
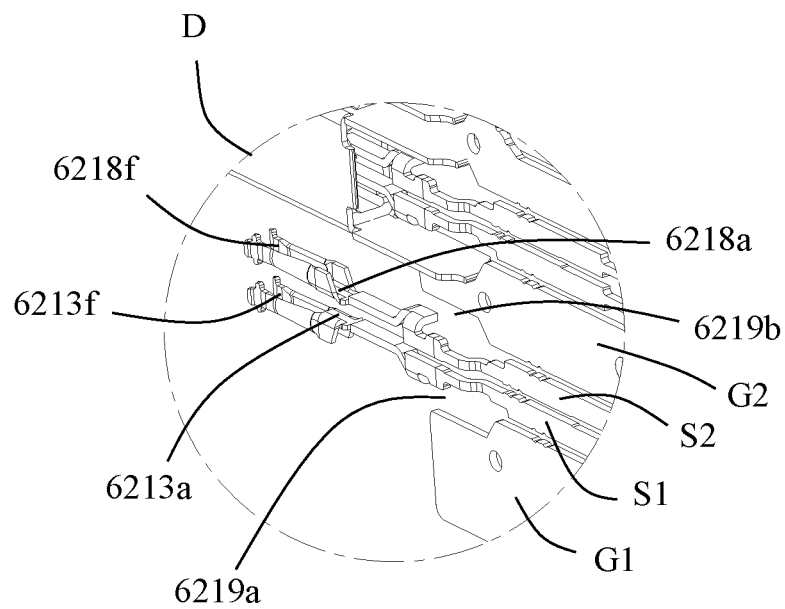
FIG. 14 is a partial enlarged view of a circled portion D in FIG. 12.

Referring to FIGS. 13 and 14, in the illustrated embodiment of the present disclosure, the first elastic arm portion 6213 and the second elastic arm portion 6218 are disposed along the top-bottom direction. A distance between the first main portion 6212a and the second main portion 6217a is greater than a distance between the first protrusion portion

6212c and the second protrusion portion 6217c. The first main portion 6213a and the second main portion 6218a are disposed back-to-back so as to improve the shielding effect. It should be noted that the "back-to-back" described in the present disclosure means that two elements are close to each other (not in contact) and are directly opposite to each other.

Each contact portion 621 of the first ground terminal G1 and the second ground terminal G2 is substantially flat. The contact portion 621 of the first ground terminal G1, the contact portion 621 of the second ground terminal G2, and the connection portions 623 of the conductive terminals 62 are all coplanar. The contact portion 621 of the first ground terminal G1 and the contact portion 621 of the second ground terminal G2 both extend into the corresponding grooves 6122 to facilitate contact with the first metal shield 63 and the second metal shield 64. The mating portion 621 of the first signal terminal S1 and the mating portion 621 of the second signal terminal S2 extend beyond the protruding block 6121.

Figure 16:
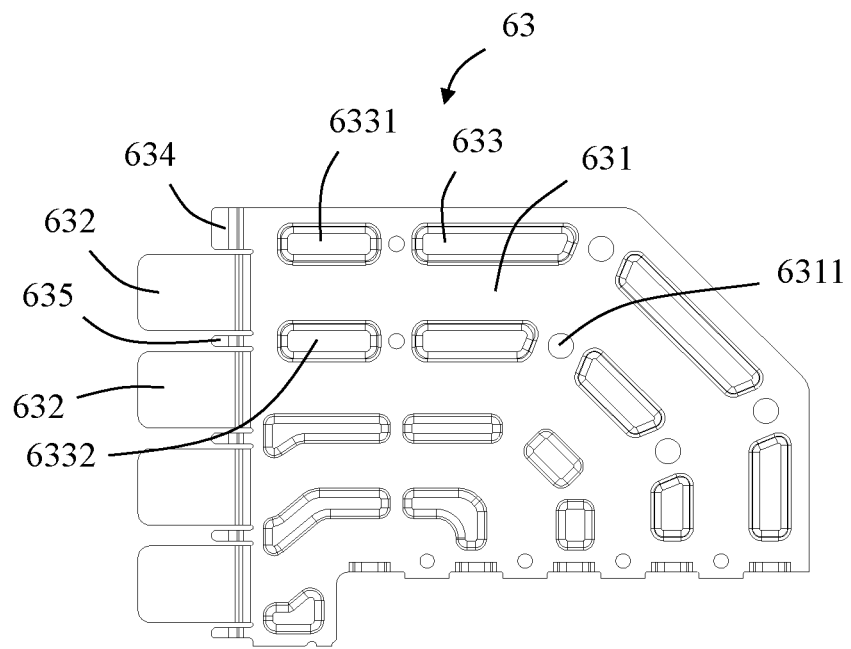
FIG. 16 is a right side view of the first metal shield in FIG. 9.

Referring to FIGS. 7, 8 and 16, in the illustrated embodiment of the present disclosure, the first metal shield 63 and the second metal shield 64 are symmetrically disposed on both sides of the insulating bracket 61. The first metal shield 63 includes a first main body portion 631, a first extension portion 632 extending from the first main body portion 631, and a first elastic arm 634 and a second elastic arm 635 which are respectively located on two sides of the first extension portion 632. In the illustrated embodiment of the present disclosure, there are multiple first extension portions 632 disposed at intervals. The first elastic arm 634 and the second elastic arm 635 extend beyond the first main body portion 631 to contact the first ground terminal G1 and the second ground terminal G2, respectively. The first main body portion 631 is located on one side of the connection portion 623 of the conductive terminal 62. In the illustrated embodiment of the present disclosure, the first extension portion 632 and the first main body portion 631 are located in different planes, in which the first extension portion 632 is farther away from the second metal shield 64 than the first main body portion 631. The first main body portion 631 includes a plurality of first mounting holes 6311 for mating with the plurality of first posts 6161. The first posts 6161 are fixed to the first mounting holes 6311 by soldering. The first main body portion 631 includes a plurality of ribs 633. The ribs 633 include a plurality of first ribs 6331 protruding toward the first ground terminal G1 and a plurality of second ribs 6332 protruding toward the second ground terminal G2. The first ribs 6331 are disposed along an extending direction of the connection portion 623 of the first ground terminal G1. The second ribs 6332 are disposed along an extending direction of the connection portion 623 of the second ground terminal G2. In the illustrated embodiment of the present disclosure, the first ribs 6331 and the second ribs 6332 are formed by stamping the first main body portion 631. The first ribs 6331 and the second ribs 6332 protrude toward the second metal shield 64. The first ribs 6331 and the second ribs 6332 are disposed discontinuously along the extending direction of the connection portion 623 of the first ground terminal G1 and the extending direction of the connection portion 623 of the second ground terminal G2, respectively, so as to achieve multi-position contact. Therefore, the reliability of the contact between the first metal shield 63 and the first ground terminals G1 and the second ground terminals G2 is improved. In the illustrated embodiment of the present disclosure, a wall thickness of the first rib 6331, a wall thickness of the second rib 6332, and a wall thickness of a portion of the first main body portion 631 located between the first rib 6331 and the second rib 6332 are the same.

Figure 17:
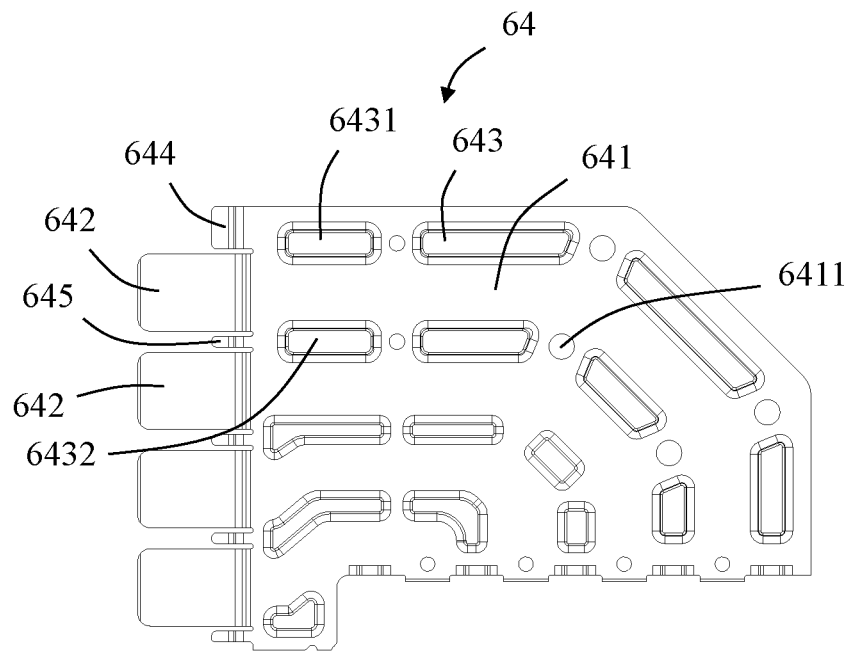
FIG. 17 is a right side view of the second metal shield in FIG. 9.

Similarly, referring to FIGS. 7, 8 and 17, the second metal shield 64 includes a second main body portion 641, a second extension portion 642 extending from the second main body portion 641, and a third elastic arm 644 and a fourth elastic arm 645 which are respectively located on both sides of the second extension portion 642. In the illustrated embodiment of the present disclosure, there are multiple second extension portion 642 disposed at intervals. The third elastic arm 644 and the fourth elastic arm 645 extend beyond the second main body portion 641 to contact the first ground terminal G1 and the second ground terminal G2, respectively. The second main body portion 641 is located on the other side of the connection portion 623 of the conductive terminal 62. In the illustrated embodiment of the present disclosure, the second extension portion 642 and the second main body portion 641 are located in different planes, in which the second extension portion 642 is farther away from the first metal shield 63 than the second main body portion 641. The second main body portion 641 includes a plurality of second mounting holes 6411 for mating with the plurality of second posts 6162. The second posts 6162 are fixed and positioned in the second mounting holes 6411 by soldering. The second main body portion 641 includes a plurality of ribs 643. The ribs 643 include a plurality of third ribs 6431 protruding toward the first ground terminal G1 and a plurality of fourth ribs 6432 protruding toward the second ground terminal G2. The third ribs 6431 are disposed along the extending direction of the connection portion 623 of the first ground terminal G1. The fourth ribs 6432 are disposed along the extending direction of the connection portion 623 of the second ground terminal G2. In the illustrated embodiment of the present disclosure, the third ribs 6431 and the fourth ribs 6432 are formed by stamping the second main body portion 641. The third ribs 6431 and the fourth ribs 6432 protrude toward the first metal shield 63. The third ribs 6431 and the fourth ribs 6432 are disposed discontinuously along the extending direction of the connection portion 623 of the first ground terminal G1 and the extending direction of the connection portion 623 of the second ground terminal G2, respectively, so as to achieve multi-position contact. Therefore, the contact reliability between the second metal shield 64 and the first ground terminals G1 and the second ground terminals G2 is improved. In the illustrated embodiment of the present disclosure, a wall thickness of the third rib 6431, a wall thickness of the fourth rib 6432, and a wall thickness of a portion of the second main body portion 641 located between the third rib 6431 and the fourth rib 6432 are the same.

In an embodiment of the present disclosure, soldering is performed on the surfaces of the ribs 633 and the ribs 643 to solder the ribs 633 and the ribs 643 to the first ground terminals G1 and the second ground terminals G2. For example, soldering is performed on the surfaces of the first ribs 6331, the second ribs 6332, the third ribs 6431 and the fourth ribs 6432 so that the first ribs 6331, the second ribs 6332, the third ribs 6431 and the fourth ribs 6432 are soldered to the first ground terminals G1 and the second ground terminals G2. The soldering method is at least one of spot soldering, laser soldering and ultrasonic soldering.

Referring to FIGS. 7 to 19, each group of terminal modules 6 further includes an insulating block 65 sleeved on the contact portions 621 of the signal terminals, and a metal shield surrounding member 66 sleeved on the insulating block 65. Each insulating block 65 is substantially cuboid shaped. The insulating block 65 includes a first side wall portion 651, a second side wall portion 652, a third side wall portion 653, and a fourth side wall portion 654 which are connected in sequence. The first side wall portion 651 is opposite to the third side wall portion 653. The second side wall portion 652 is opposite to the fourth side wall portion 654. An area of either of the first side wall portion 651 and the third side wall portion 653 is smaller than an area of either of the second side wall portion 652 and the fourth side wall portion 654. In addition, the insulating block 65 further includes a mating surface 655 at a front end and a mounting surface 656 at a rear end opposite to the mating surface 655. The insulating block 65 includes a first through hole 6551 extending through the mating surface 655 and the mounting surface 656 and used for insertion of the mating portion 621 of the first signal terminal S1; and a second through hole 6552 extending through the mating surface 655 and the mounting surface 656 and used for insertion of the mating portion 621 of the second signal terminal S2. The first through hole 6551 and the second through hole 6552 are disposed along the top-bottom direction. The first side wall portion 651 further includes a first slot 6511 and a first resisting rib 6512 located behind the first slot 6511. The third side wall portion 653 further includes a second slot 6531 and a second resisting rib 6532 located behind the second slot 6531. Both the first slot 6511 and the second slot 6531 extend forwardly through the mating surface 655. The second side wall portion 652 includes a first opening 6521 and a second opening 6522 which are in communication with the first through hole 6551 and the second through hole 6552, respectively. The fourth side wall portion 654 includes a third opening 6541 and a fourth opening 6542 which are in communication with the first through hole 6551 and the second through hole 6552, respectively. When the conductive pin of the mating backplane connector is inserted, the first opening 6521, the second opening 6522, the third opening 6541 and the fourth opening 6542 can provide the first elastic arm portion 6213 and the second elastic arm portion 6218 more spaces for deformation.

Correspondingly, the metal shield surrounding member 66 is substantially cuboid shaped. In an embodiment of the present disclosure, the insulating block 65 is fixed in the metal shield surrounding member 66 by soldering. Of course, in other embodiments, the insulating block 65 may also be fixed in the metal shield surrounding member 66 in other ways.

Figure 18:
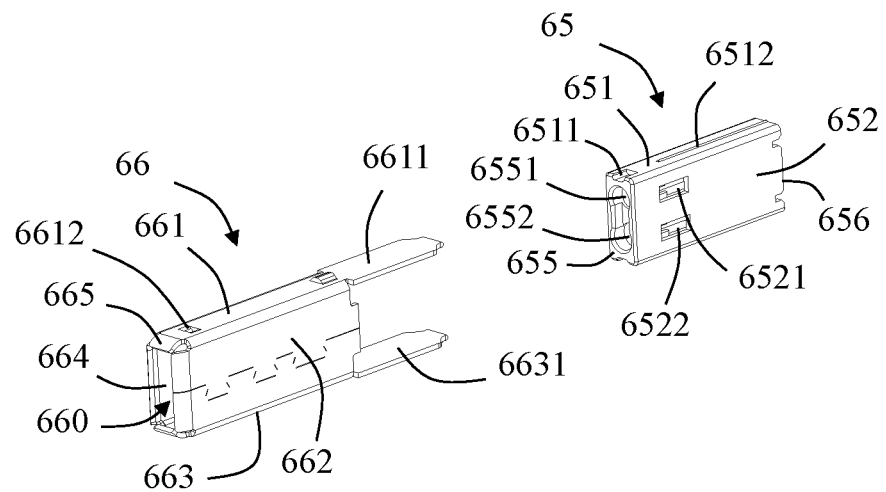
FIG. 18 is a perspective schematic view when the insulating block and the metal shield surrounding member are separated from each other.
Figure 19:
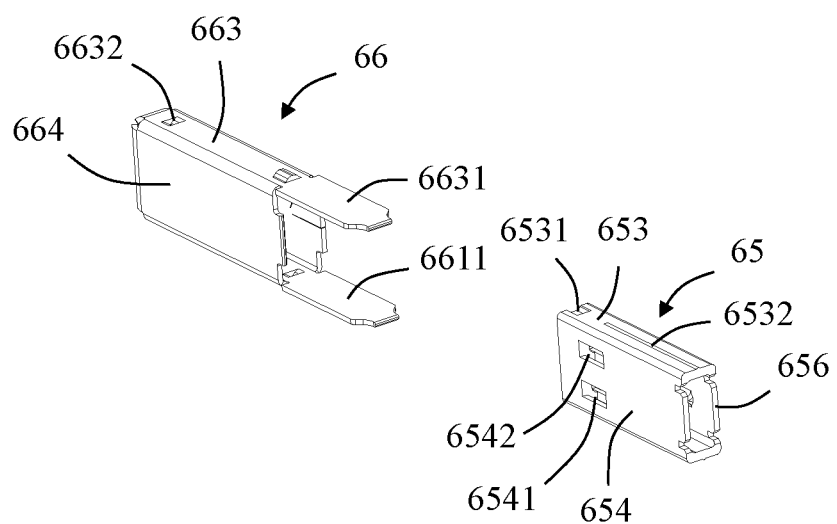
FIG. 19 is a perspective schematic view of FIG. 18 from another angle.

Referring to FIGS. 18 and 19, the metal shield surrounding member 66 includes a first side wall 661, a second side wall 662, a third side wall 663, a fourth side wall 664 and an accommodating space 660. The first side wall 661, the second side wall 662, the third side wall 663 and the fourth side wall 664 are connected in sequence. The first side wall 661 is opposite to the third side wall 663. The second side wall 662 is opposite to the fourth side wall 664. An area of either of the first side wall 661 and the third side wall 663 is smaller than an area of either of the second side wall 662 and the fourth side wall 664. The accommodating space 660 is jointly enclosed by the first side wall 661, the second side wall 662, the third side wall 663 and the fourth side wall 664. The accommodating space 660 extends along the top-bottom direction, which means a height of the accommodating space 660 along the top-bottom direction is greater than a width of the accommodating space 660 along the left-right direction. Each end of the first side wall 661, the second side wall 662, the third side wall 663 and the fourth side wall 664 includes a deflection portion 665 which is bent inwardly. By providing the deflection portions 665, a constricted portion can be formed at an end of the metal shield surrounding member 66 so as to facilitate the guiding insertion of the mating backplane connector (not shown). In addition, in order to better limit the insulating block 65, the first side wall 661 and the third side wall 663 respectively include a first limiting protrusion 6612 and a second limiting protrusion 6632 formed by stamping inwardly. The first limiting protrusion 6612 is used to be locked in the first slot 6511, and the second limiting protrusion 6632 is used to be locked in the second slot 6531 so that the insulating block 65 can be prevented from being drawn out from the metal shield surrounding member 66. In addition, the first resisting rib 6512 and the second resisting rib 6532 abut against the first side wall 661 and the third side wall 663, respectively, thereby increasing friction and improving the assembly tightness.

Figure 10:
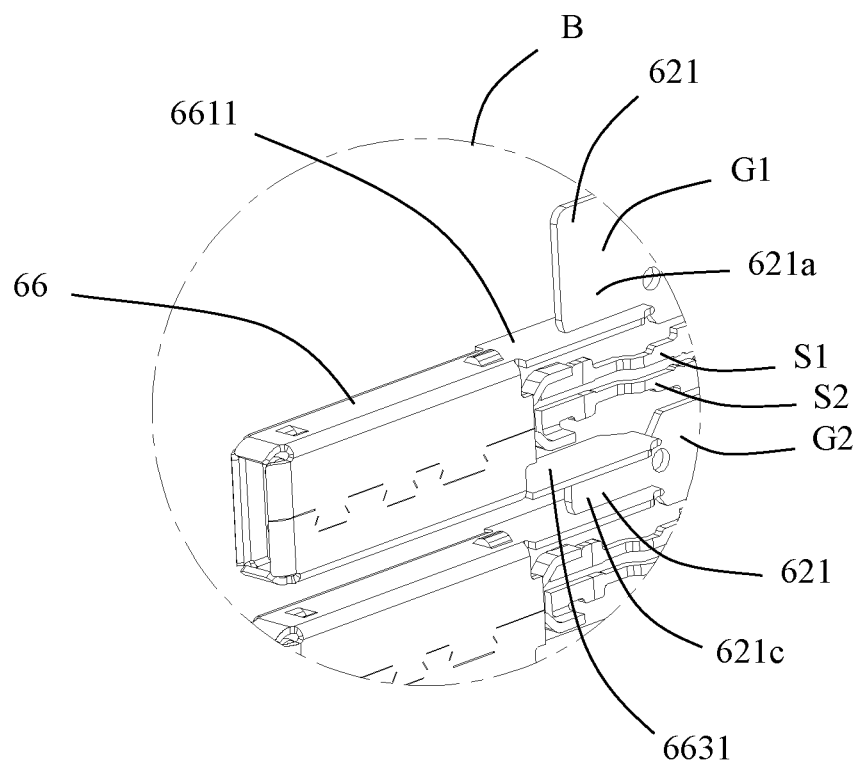
FIG. 10 is a partial enlarged view of a circled portion B in FIG. 9.
Figure 11:
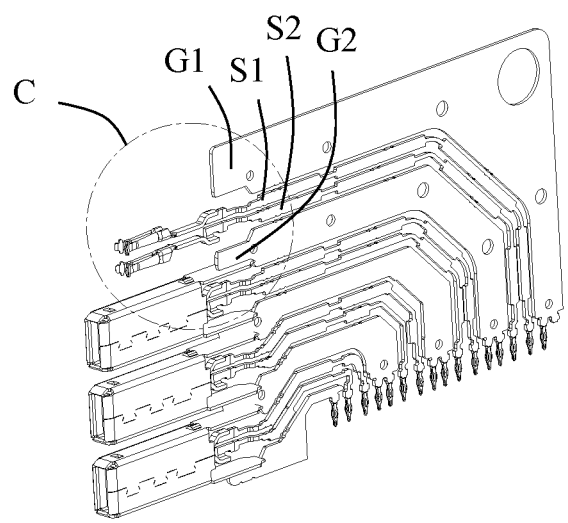
FIG. 11 is a partially perspective view of the terminal module with conductive terminals some of the insulating blocks and some of the metal shield surrounding members assembled together.
Figure 12:
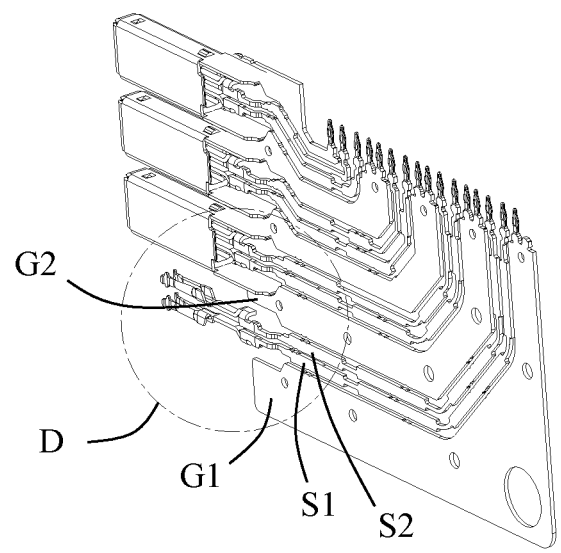
FIG. 12 is a perspective schematic view of FIG. 11 from another angle.

In the illustrated embodiment of the present disclosure, the metal shield surrounding member 66 further includes a first extension piece 6611 extending from the first side wall 661, and a second extension piece 6631 extending from the third side wall 663. The first extension piece 6611 is in vertical contact with the mating portion 621 of the first ground terminal G1 so as to improve the shielding effect. The second extension piece 6631 is in vertical contact with the mating portion 621 of the second ground terminal G2 so as to improve the shielding effect. Referring to FIGS. 10, 13 and 14, for a group of conductive terminals 62 disposed in an manner of G1-S1-S2-G2, the mating portion 621 of the first ground terminal G1 includes a first notch 6219*a* adjacent to the differential signal terminals for receiving the first extension piece 6611, and the mating portion 621 of the second ground terminal G2 includes a second notch 6219*b* adjacent to the differential signal terminals for receiving the second extension piece 6631. In the illustrated embodiment of the present disclosure, taking two adjacent pairs of differential signal terminals sharing one second ground terminal G2 as an example, two sides of the second ground terminal G2 respectively include second notches 6219*b* facing different differential signal terminals, and the second notches 6219*b* are used for mating with two adjacent metal shield surrounding members 66.

Figure 20:
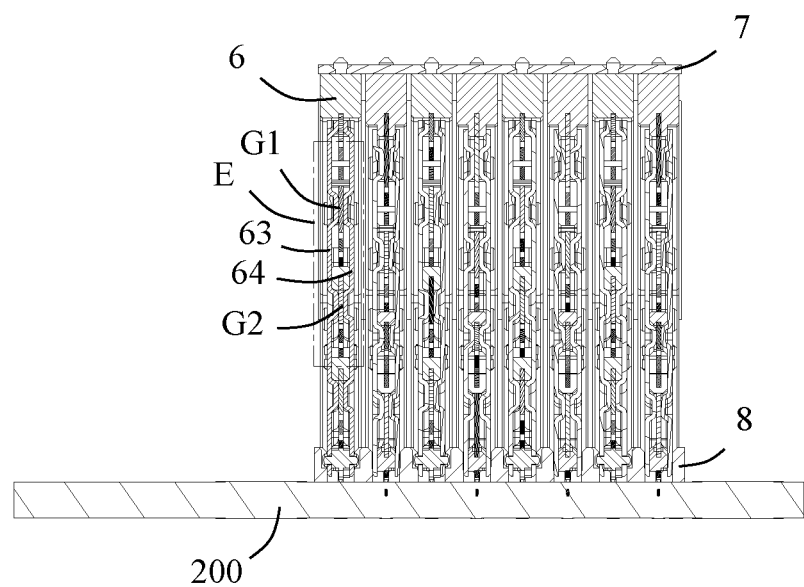
FIG. 20 is a schematic cross-sectional view taken along line A-A in FIG. 1.
Figure 21:
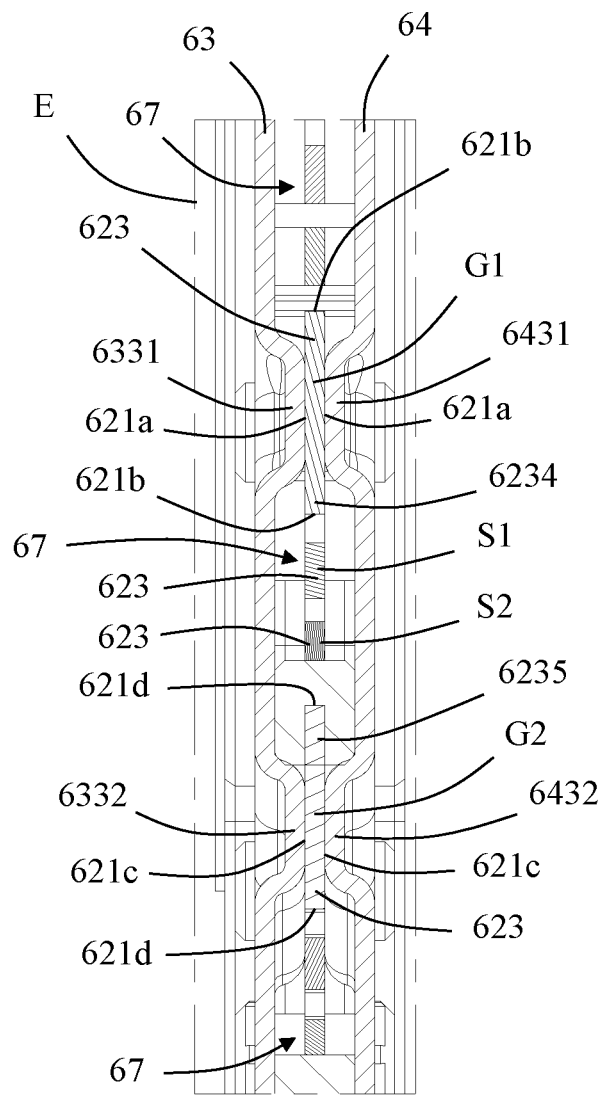
FIG. 21 is a partial enlarged view of a frame portion E in FIG. 20.

Referring to FIGS. 20 and 21, in the illustrated embodiment of the present disclosure, the connection portion 623 of the first ground terminal G1 includes a first wide surface 621*a* and a first narrow surface 621*b* perpendicular to the first wide surface 621*a*. The connection portion 623 of the second ground terminal G2 includes a second wide surface 621*c* and a second narrow surface 621*d* perpendicular to the second wide surface 621*c*. The connection portions 623 of each pair of differential signal terminals are located between the first narrow surface 621*b* of the first ground terminal G1 and the second narrow surface 621*d* of the second ground terminal G2 which are located on opposite sides of the connection portions 623 of each pair of differential signal terminals.

In the length of the connection portion 623 of the conductive terminal 62, the first rib 6331 of the first metal shield 63 and the third rib 6431 of the second metal shield 64 are in contact with two opposite side surfaces of the connection portion 623 of the first ground terminal G1, respectively. The second rib 6332 of the first metal shield 63 and the fourth rib 6432 of the second metal shield 64 are in contact with two opposite side surfaces of the connection portion 623 of the second ground terminal G2, respectively. As a result, a shielding cavity 67 surrounding the outer periphery of the connection portions 623 of each pair of differential signal terminals is formed. In the illustrated embodiment of the present disclosure, the first rib 6331 and the third rib 6431 contact the first wide surface 621a of the connection portion 623 of the first ground terminal G1, respectively. The second rib 6332 and the fourth rib 6432 contact the second wide surface 621c of the connection portion 623 of the second ground terminal G2, respectively. In the illustrated embodiment of the present disclosure, the shielding cavity 67 is formed by the first main body portion 631, the second main body portion 641, the first ground terminal G1 and the second ground terminal G2. The connection portion 623 of the first ground terminal G1 includes a first tab portion 6234 extending into the shielding cavity 67. The connection portion 623 of the second ground terminal G2 includes a second tab portion 6235 extending into the shielding cavity 67. The connection portions 623 of the differential signal terminals are located between the first tab portion 6234 and the second tab portion 6235. In the illustrated embodiment of the present disclosure, there are a plurality of shielding cavities 67 which are disposed along an arrangement direction of each group of the conductive terminals 62. Two adjacent shielding cavities 67 share a single first ground terminal G1 or a single second ground terminal G2. Taking the shared first ground terminal G1 as an example, a part of the shared first ground terminal G1 protrudes into one shielding cavity 67, and another part of the shared first ground terminal G1 protrudes into another shielding cavity 67.

Referring to FIGS. 7 to 10, at a position adjacent to the contact portion 621 of the conductive terminal 62, the first extension portion 632 and the second extension portion 642 are in contact with the fourth side wall 664 and the second side wall 662 of the metal shield surrounding member 66, respectively. The first extension piece 6611 and the second extension piece 6631 of the metal shield surrounding member 66 are inserted into the first notch 6219a of the first ground terminal G1 and the second notch 6219b of the second ground terminal G2, respectively. At the same time, the first elastic arm 634 of the first metal shield 63 and the third elastic arm 644 of the second metal shield 64 clamp both sides of the contact portion 621 of the first ground terminal G1. The second elastic arm 635 of the first metal shield 63 and the fourth elastic arm 645 of the second metal shield 64 clamp both sides of the contact portion 621 of the second ground terminal G2. Specifically, the first elastic arm 634 and the third elastic arm 644 clamp the first wide surfaces 621a of the first ground terminal G1. The second elastic arm 635 and the fourth elastic arm 645 clamp the second wide surfaces 621c of the second ground terminal G2. With this arrangement, the first metal shield 63, the second metal shield 64, the metal shield surrounding member 66, the first ground terminal G1, and the second ground terminal G2 are all connected in series, thereby the shielding area is increased and the shielding effect is improved.

In the illustrated embodiment of the present disclosure, there are multiple terminal modules 6 of the backplane connector 100, and the terminal arrangement of two adjacent terminal modules 6 are staggered. Correspondingly, the shielding cavities 67 of two adjacent terminal modules 6 are also staggered. When the terminal module 6 is assembled to the housing 5, the metal shield surrounding member 66 of the terminal module 6 passes through the corresponding terminal receiving grooves 511 so as to extend into the receiving space 535.

Figure 6:
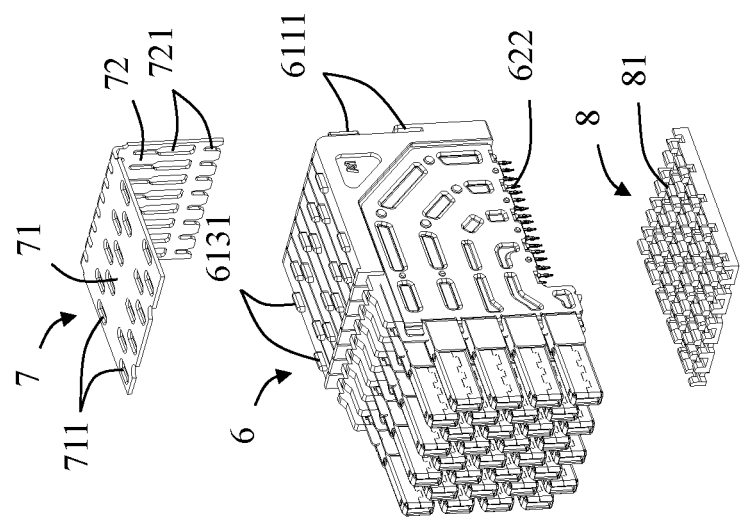
FIG. 6 is a further perspective exploded view of FIG. 4.
Figure 6:
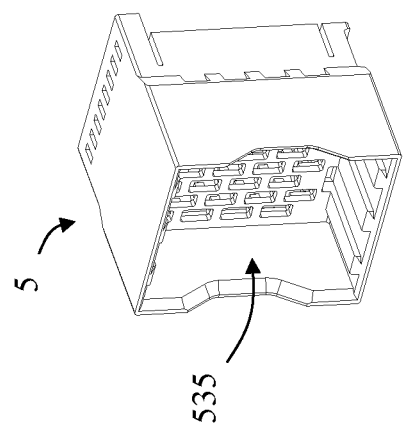

Referring to FIG. 6, in the illustrated embodiment of the present disclosure, the spacer 7 is made of metal material or insulating material. The spacer 7 is substantially L-shaped and includes a body portion 71 and an extension piece 72 bent from the body portion 71. The body portion 71 includes a plurality of positioning grooves 711 for receiving the positioning protrusions 6131. The extension piece 72 includes a plurality of clamping grooves 721 for clamping the latching protrusions 6111. All the terminal modules 6 can be combined into a whole by providing the spacer 7 so as to prevent loosening.

Referring to FIG. 6, the mounting block 8 includes a plurality of holes 81 for allowing the tail portions 622 of the conductive terminals 62 to pass through, so as to fix and position the tail portions 622. As a result, it is convenient to install these tail portions 622 into the insertion holes 201 of the circuit board 200. In an embodiment of the present disclosure, the holding block 8 is made of conductive plastic or electroplated plastic in order to further improve the shielding effect.

In order to help better understanding of the present disclosure, in one terminal module 6 of the present disclosure, a direction in which the metal shield surrounding members 66 are disposed at intervals is a first direction. A direction in which the first metal shield 63 and the second metal shield 64 are spaced apart is a second direction. The extending direction of the mating portions 621 of the conductive terminals 62 is a third direction. In the illustrated embodiment of the present disclosure, the first direction is the top-bottom direction. The second direction is the left-right direction. The third direction is the front-rear direction. The second direction is perpendicular to the first direction. The third direction is perpendicular to the first direction and the second direction.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising:
   a housing comprising a receiving space; and
   a plurality of terminal modules mounted to the housing, each terminal module comprising:
   a plurality of conductive terminals, each of the conductive terminals comprising a mating portion and a tail portion;
   a plurality of metal shield surrounding members which are spaced apart from one another along a first direction and protrude into the receiving space;
   a first metal shield located on one side of the plurality of conductive terminals, the first metal shield comprising a first extension portion; and
   a second metal shield located on another side of the plurality of conductive terminals, the second metal shield comprising a second extension portion;
   wherein the conductive terminals comprise a first signal terminal and a second signal terminal, each of the first signal terminal and the second signal terminal comprises the mating portion and the tail portion, the mating portion of the first signal terminal and the mating portion of the second signal terminal both protrude into the receiving space and are spaced apart from each other along the first direction;

wherein the metal shield surrounding member surrounds a periphery of the mating portion of the first signal terminal and the mating portion of the second signal terminal;

wherein the first extension portion and the second extension portion are electrically connected to the metal shield surrounding member along a second direction perpendicular to the first direction;

wherein each terminal module further comprises an insulating bracket, each conductive terminal comprises a connection portion connecting the mating portion and the tail portion, the connection portions of the conductive terminals are at least partially fixed to the insulating bracket, the mating portion of the first signal terminal and the mating portion of the second signal terminal protrude beyond the insulating bracket in a third direction perpendicular to the first direction and the second direction;

wherein the conductive terminals comprise a first ground terminal and a second ground terminal, and the first signal terminal and the second signal terminal are located between the first ground terminal and the second ground terminal; and wherein the first metal shield comprises a first elastic arm and a second elastic arm which are located on opposite sides of the first extension portion, respectively; the second metal shield comprises a third elastic arm and a fourth elastic arm which are located on opposite sides of the second extension portion, respectively; the first elastic arm and the third elastic arm are electrically connected to the mating portion of the first ground terminal; and the second elastic arm and the fourth elastic arm are electrically connected to the mating portion of the second ground terminal.

2. The backplane connector according to claim 1, wherein the tail portion comprises a perforation so that the tail portion can be pressed into an insertion hole of a circuit board.

3. The backplane connector according to claim 1, wherein the insulating bracket comprises a top wall and a bottom wall, the top wall comprises a first locking protrusion, and the bottom wall comprises a second locking protrusion; and wherein the housing comprises a first wall portion and a second wall portion opposite to the first wall portion, the first wall portion comprises a first locking slot locked with the first locking protrusion, and the second wall portion comprises a second locking slot locked with the second locking protrusion.

4. A backplane connector, comprising:

a housing comprising a receiving space; and a plurality of terminal modules mounted to the housing, each terminal module comprising:

a plurality of conductive terminals, each of the conductive terminals comprising a mating portion and a tail portion;

a plurality of metal shield surrounding members which are spaced apart from one another along a first direction and protrude into the receiving space;

a first metal shield located on one side of the plurality of conductive terminals, the first metal shield comprising a first extension portion; and a second metal shield located on another side of the plurality of conductive terminals, the second metal shield comprising a second extension portion;

wherein the conductive terminals comprise a first signal terminal and a second signal terminal, each of the first signal terminal and the second signal terminal comprises the mating portion and the tail portion, the mating portion of the first signal terminal and the mating portion of the second signal terminal both protrude into the receiving space and are spaced apart from each other along the first direction;

wherein the metal shield surrounding member surrounds a periphery of the mating portion of the first signal terminal and the mating portion of the second signal terminal;

wherein the first extension portion and the second extension portion are electrically connected to the metal shield surrounding member along a second direction perpendicular to the first direction;

wherein each terminal module further comprises an insulating bracket, each conductive terminal comprises a connection portion connecting the mating portion and the tail portion, the connection portions of the conductive terminals are at least partially fixed to the insulating bracket, the mating portion of the first signal terminal and the mating portion of the second signal terminal protrude beyond the insulating bracket in a third direction perpendicular to the first direction and the second direction;

wherein the conductive terminals comprise a first ground terminal and a second ground terminal, and the first signal terminal and the second signal terminal are located between the first ground terminal and the second ground terminal;

wherein the metal shield surrounding member comprises a first side wall, a second side wall, a third side wall and a fourth side wall; the first side wall is disposed opposite to the third side wall; the second side wall is disposed opposite to the fourth side wall; an area of either of the first side wall and the third side wall is smaller than an area of either of the second side wall and the fourth side wall; and wherein the metal shield surrounding member further comprises a first extension piece extending from the first side wall, and a second extension piece extending from the third side wall; the first extension piece is in vertical contact with the mating portion of the first ground terminal; and the second extension piece is in vertical contact with the mating portion of the second ground terminal.

5. The backplane connector according to claim 4, wherein the metal shield surrounding member comprises an accommodating space enclosed by the first side wall, the second side wall, the third side wall and the fourth side wall; each terminal module comprises an insulating block received in the accommodating space; and the insulating block comprises a first through hole which accommodates the mating portion of the first signal terminal, and a second through hole which accommodates the mating portion of the second signal terminal.

6. The backplane connector according to claim 1, wherein the first metal shield comprises a first main body portion connected to the first extension portion, the first main body portion comprises a first rib protruding toward the first ground terminal and a second rib protruding toward the second ground terminal;

wherein the second metal shield comprises a second main body portion connected to the second extension portion, the second main body portion comprises a third rib protruding toward the first ground terminal and a fourth rib protruding toward the second ground terminal; and wherein the first rib and the third rib are in contact with opposite side surfaces of the connection portion of the first ground terminal, respectively; the second rib and the fourth rib are in contact with opposite side surfaces of the connection portion of the second ground terminal, respectively; the first main body portion, the second main body portion, the first ground terminal and the second ground terminal are enclosed to form a shielding cavity enclosing the connection portion of the first signal terminal and the connection portion of the second signal terminal.

7. A backplane connector, comprising:

a housing comprising a receiving space; and a plurality of terminal modules mounted to the housing, each terminal module comprising:

a plurality of conductive terminals, each of the conductive terminals comprising a mating portion and a tail portion;

a plurality of metal shield surrounding members which are spaced apart from one another along a first direction and protrude into the receiving space;

a first metal shield located on one side of the plurality of conductive terminals, the first metal shield comprising a first extension portion; and a second metal shield located on the another of the plurality of conductive terminals, the second metal shield comprising a second extension portion;

wherein the conductive terminals comprise a first signal terminal and a second signal terminal, each of the first signal terminal and the second signal terminal comprises the mating portion and the tail portion, the mating portion of the first signal terminal and the mating portion of the second signal terminal both protrude into the receiving space and are spaced apart from each other along the first direction;

wherein the metal shield surrounding member surrounds a periphery of the mating portion of the first signal terminal and the mating portion of the second signal terminal;

wherein the first extension portion and the second extension portion are electrically connected to the metal shield surrounding member along a second direction perpendicular to the first direction;

wherein the mating portion of the first signal terminal comprises a first elastic arm portion, and the mating portion of the second signal terminal comprises a second elastic arm portion;

wherein the first elastic arm portion comprises a first main portion, a first elastic arm bent upwardly from one side of the first main portion, and a second elastic arm bent upwardly from the other side of the first main portion; and wherein the second elastic arm portion comprises a second main portion, a third elastic arm bent downwardly from one side of the second main portion, and a fourth elastic arm bent downwardly from the other side of the second main portion.

8. The backplane connector according to claim 7, wherein the first main portion and the second main portion are disposed back to back.

9. The backplane connector according to claim 7, wherein each conductive terminal further comprises a connection portion connected between the mating portion and the tail portion, each of the first signal terminal and the second signal terminal comprises the connection portion;

wherein the mating portion of the first signal terminal comprises a first deflection portion integrally extending from the connection portion of the first signal terminal, and a first bending portion bent from a top of the first deflection portion, the first bending portion is connected to the first elastic arm portion; and wherein the mating portion of the second signal terminal comprises a second deflection portion integrally extending from the connection portion of the second signal terminal, and a second bending portion bent from a bottom of the second deflection portion, the second bending portion is connected to the second elastic arm portion.

10. The backplane connector according to claim 1, wherein wherein the metal shield surrounding member comprises a first side wall, a second side wall, a third side wall and a fourth side wall; the first side wall is disposed opposite to the third side wall; the second side wall is disposed opposite to the fourth side wall; an area of either of the first side wall and the third side wall is smaller than an area of either of the second side wall and the fourth side wall; and wherein the metal shield surrounding member further comprises a first extension piece extending from the first side wall, and a second extension piece extending from the third side wall; the first extension piece is in vertical contact with the mating portion of the first ground terminal; and the second extension piece is in vertical contact with the mating portion of the second ground terminal.

11. The backplane connector according to claim 10, wherein the metal shield surrounding member comprises an accommodating space enclosed by the first side wall, the second side wall, the third side wall and the fourth side wall; each terminal module comprises an insulating block received in the accommodating space; and the insulating block comprises a first through hole which accommodates the mating portion of the first signal terminal, and a second through hole which accommodates the mating portion of the second signal terminal.

12. The backplane connector according to claim 1, wherein the first metal shield comprises a first main body portion connected to the first extension portion, the first main body portion comprises a first rib protruding toward the first ground terminal and a second rib protruding toward the second ground terminal;

wherein the second metal shield comprises a second main body portion connected to the second extension portion, the second main body portion comprises a third rib protruding toward the first ground terminal and a fourth rib protruding toward the second ground terminal; and wherein the first rib and the third rib are in contact with opposite side surfaces of the connection portion of the first ground terminal, respectively; the second rib and the fourth rib are in contact with opposite side surfaces of the connection portion of the second ground terminal, respectively; the first main body portion, the second main body portion, the first ground terminal and the second ground terminal are enclosed to form a shielding cavity enclosing the connection portion of the first signal terminal and the connection portion of the second signal terminal.

13. The backplane connector according to claim 1, wherein the mating portion of the first signal terminal comprises a first elastic arm portion, and the mating portion of the second signal terminal comprises a second elastic arm portion;
wherein the first elastic arm portion comprises a first main portion, a first elastic arm bent upwardly from one side of the first main portion, and a second elastic arm bent upwardly from the other side of the first main portion; and
wherein the second elastic arm portion comprises a second main portion, a third elastic arm bent downwardly from one side of the second main portion, and a fourth elastic arm bent downwardly from the other side of the second main portion.

14. The backplane connector according to claim 13, wherein the first main portion and the second main portion are disposed back to back.

15. The backplane connector according to claim 13, wherein each conductive terminal further comprises a connection portion connected between the mating portion and the tail portion, each of the first signal terminal and the second signal terminal comprises the connection portion;
wherein the mating portion of the first signal terminal comprises a first deflection portion integrally extending from the connection portion of the first signal terminal, and a first bending portion bent from a top of the first deflection portion, the first bending portion is connected to the first elastic arm portion; and
wherein the mating portion of the second signal terminal comprises a second deflection portion integrally extending from the connection portion of the second signal terminal, and a second bending portion bent from a bottom of the second deflection portion, the second bending portion is connected to the second elastic arm portion.

16. The backplane connector according to claim 4, wherein the mating portion of the first signal terminal comprises a first elastic arm portion, and the mating portion of the second signal terminal comprises a second elastic arm portion;
wherein the first elastic arm portion comprises a first main portion, a first elastic arm bent upwardly from one side of the first main portion, and a second elastic arm bent upwardly from the other side of the first main portion; and
wherein the second elastic arm portion comprises a second main portion, a third elastic arm bent downwardly from one side of the second main portion, and a fourth elastic arm bent downwardly from the other side of the second main portion.

17. The backplane connector according to claim 16, wherein the first main portion and the second main portion are disposed back to back.

18. The backplane connector according to claim 16, wherein each conductive terminal further comprises a connection portion connected between the mating portion and the tail portion, each of the first signal terminal and the second signal terminal comprises the connection portion;
wherein the mating portion of the first signal terminal comprises a first deflection portion integrally extending from the connection portion of the first signal terminal, and a first bending portion bent from a top of the first deflection portion, the first bending portion is connected to the first elastic arm portion; and
wherein the mating portion of the second signal terminal comprises a second deflection portion integrally extending from the connection portion of the second signal terminal, and a second bending portion bent from a bottom of the second deflection portion, the second bending portion is connected to the second elastic arm portion.

19. The backplane connector according to claim 7, wherein the tail portion comprises a perforation so that the tail portion can be pressed into an insertion hole of a circuit board.

20. The backplane connector according to claim 7, wherein the insulating bracket comprises a top wall and a bottom wall, the top wall comprises a first locking protrusion, and the bottom wall comprises a second locking protrusion; and
wherein the housing comprises a first wall portion and a second wall portion opposite to the first wall portion, the first wall portion comprises a first locking slot locked with the first locking protrusion, and the second wall portion comprises a second locking slot locked with the second locking protrusion.

* * * * *